(12) United States Patent
Negley

(10) Patent No.: US 8,748,920 B2
(45) Date of Patent: Jun. 10, 2014

(54) LIGHT-EMITTING DEVICES HAVING AN ANTIREFLECTIVE LAYER THAT HAS A GRADED INDEX OF REFRACTION AND METHODS OF FORMING THE SAME

(75) Inventor: Gerald H. Negley, Carrboro, NC (US)

(73) Assignee: Cree, Inc., Durham, NC (US)

( * ) Notice: Subject to any disclaimer, the term of this patent is extended or adjusted under 35 U.S.C. 154(b) by 984 days.

(21) Appl. No.: 11/478,873

(22) Filed: Jun. 30, 2006

(65) Prior Publication Data

US 2006/0278883 A1 Dec. 14, 2006

Related U.S. Application Data

(62) Division of application No. 10/818,620, filed on Apr. 6, 2004, now Pat. No. 7,087,936.

(60) Provisional application No. 60/466,618, filed on Apr. 30, 2003.

(51) Int. Cl.
*H01L 33/00* (2010.01)

(52) U.S. Cl.
USPC .................. 257/98; 257/100; 257/E33.068

(58) Field of Classification Search
USPC .............................................. 257/98, E33.068
See application file for complete search history.

(56) References Cited

U.S. PATENT DOCUMENTS

| | | |
|---|---|---|
| 1,136,218 A | 12/1968 | Sterling et al. |
| 4,568,140 A | 2/1986 | Van der Werf et al. ......... 350/1.6 |
| 4,583,822 A | 4/1986 | Southwell ..................... 350/164 |
| 4,918,497 A | 4/1990 | Edmond ......................... 257/77 |
| 4,934,788 A | 6/1990 | Southwell ..................... 350/164 |
| 4,966,862 A | 10/1990 | Edmond ......................... 438/27 |
| 5,027,168 A | 6/1991 | Edmond ........................ 257/103 |
| 5,100,233 A | 3/1992 | Southwell ..................... 356/128 |
| 5,210,051 A | 5/1993 | Carter, Jr. et al. ............... 438/22 |
| 5,225,244 A | 7/1993 | Aharoni et al. ............... 427/240 |

(Continued)

FOREIGN PATENT DOCUMENTS

EP 0 519 690 A1 12/1992 ............. C03C 17/34

OTHER PUBLICATIONS

International Search Report and Written Opinion for PCT US2004/011359; date of mailing Nov. 24, 2004.

(Continued)

*Primary Examiner* — Hsin-Yi Hsieh
(74) *Attorney, Agent, or Firm* — Myers Bigel Sibley & Sajovec, PA

(57) ABSTRACT

A light-emitting device includes a substrate that is at least partially transparent to optical radiation and has a first index of refraction. A diode region is disposed on a first surface of the substrate and is configured to emit light responsive to a voltage applied thereto. An encapsulation layer is disposed on a second surface of the substrate and has a second index of refraction. An antireflective layer is disposed between a second surface of the substrate and the encapsulation layer. The antireflective layer has a graded index of refraction having values in a range between about the first index of refraction at a first surface of the antireflective layer and about the second index of refraction at a second surface of the antireflective layer. The encapsulation layer may also be omitted and the antireflective layer may separate the substrate, which has a first index of refraction, from air, which has a second index of refraction. Non "flip-chip" embodiments are also disclosed.

6 Claims, 4 Drawing Sheets

(56) References Cited

U.S. PATENT DOCUMENTS

| | | | |
|---|---|---|---|
| 5,338,944 A | 8/1994 | Edmond et al. | 257/76 |
| 5,351,255 A * | 9/1994 | Schetzina | 372/45.01 |
| 5,393,993 A | 2/1995 | Edmond et al. | 257/77 |
| 5,416,342 A | 5/1995 | Edmond et al. | 257/76 |
| 5,523,589 A | 6/1996 | Edmond et al. | 257/77 |
| 5,604,135 A | 2/1997 | Edmond et al. | 438/45 |
| 5,631,190 A | 5/1997 | Negley | 438/33 |
| 5,698,352 A | 12/1997 | Ogawa et al. | 430/14 |
| 5,739,554 A | 4/1998 | Edmond et al. | 257/103 |
| 5,767,581 A | 6/1998 | Nakamura et al. | 257/749 |
| 5,909,303 A | 6/1999 | Trezza et al. | 359/248 |
| 5,912,477 A | 6/1999 | Negley | 257/95 |
| 5,977,566 A * | 11/1999 | Okazaki et al. | 257/99 |
| 6,120,600 A | 9/2000 | Edmond et al. | 117/89 |
| 6,177,688 B1 | 1/2001 | Linthicum et al. | 257/77 |
| 6,187,606 B1 | 2/2001 | Edmond et al. | 438/46 |
| 6,201,262 B1 | 3/2001 | Edmond et al. | 257/77 |
| 6,811,901 B1 * | 11/2004 | Arfsten et al. | 428/701 |
| 6,900,473 B2 | 5/2005 | Yoshitake et al. | 257/95 |
| 6,900,474 B2 | 5/2005 | Misra et al. | 257/98 |
| 2001/0026011 A1 * | 10/2001 | Roberts et al. | 257/678 |
| 2001/0031811 A1 | 10/2001 | Li et al. | 524/262 |
| 2002/0121642 A1 | 9/2002 | Doverspike et al. | 257/97 |
| 2002/0123164 A1 | 9/2002 | Slater, Jr. et al. | 438/39 |
| 2002/0140879 A1 | 10/2002 | Fujieda | 349/69 |
| 2002/0195609 A1 * | 12/2002 | Yoshitake et al. | 257/81 |
| 2003/0006418 A1 | 1/2003 | Emerson et al. | 257/79 |
| 2003/0218798 A1 | 11/2003 | Kanazawa et al. | 359/359 |
| 2004/0056260 A1 | 3/2004 | Slater, Jr. et al. | 257/79 |
| 2004/0061123 A1 * | 4/2004 | Shelton et al. | 257/99 |
| 2004/0188696 A1 * | 9/2004 | Hsing Chen et al. | 257/99 |

OTHER PUBLICATIONS

First Examination Report (15 pages) from India Patent Office corresponding to Indian Patent Application No. 4562/DELNP/2005; Dated Jul. 25, 2008.

* cited by examiner

LIGHT-EMITTING DEVICES HAVING AN ANTIREFLECTIVE LAYER THAT HAS A GRADED INDEX OF REFRACTION AND METHODS OF FORMING THE SAME

RELATED APPLICATION

This application claims priority to and is a divisional of parent application Ser. No. 10/818,620, filed Apr. 6, 2004 now U.S. Pat. No. 7,087,936, which claims the benefit of and priority to U.S. Provisional Patent Application No. 60/466,618, filed Apr. 30, 2003, the disclosure of which is hereby incorporated herein by reference as if set forth in its entirety.

BACKGROUND OF THE INVENTION

The present invention relates generally to microelectronic devices and fabrication methods therefor, and, more particularly, to light-emitting devices and fabrication methods therefor.

Light-emitting diodes (LEDs) are widely used in consumer and commercial applications. As is well known to those skilled in the art, a light-emitting diode generally includes a diode region on a microelectronic substrate. The microelectronic substrate may comprise, for example, gallium arsenide, gallium phosphide, alloys thereof, silicon carbide, and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with well entrenched incandescent and fluorescent lamps.

Referring now to FIG. 1, a conventional GaN-based LED 100 comprises a SiC substrate 105 that has first and second opposing surfaces 110a and 110b, respectively, and is at least partially transparent to optical radiation. A diode region, comprising an n-type layer 115, an active region 120, and a p-type layer 125 is disposed on the second surface 110b and is configured to emit optical radiation into the SiC substrate 105 upon application of a voltage across the diode region, for example across ohmic contacts 130 and 135.

The diode region including the n-type layer 115, the active region 120, and/or the p-type layer 125 may comprise gallium nitride-based semiconductor layers, including alloys thereof, such as indium gallium nitride and/or aluminum indium gallium nitride. The fabrication of gallium nitride on silicon carbide is known to those skilled in the art, and is described, for example, in U.S. Pat. No. 6,177,688, the disclosure of which is hereby incorporated herein by reference. It will also be understood that a buffer layer or layers comprising aluminum nitride, for example, may be provided between the n-type gallium nitride layer 115 and the silicon carbide substrate 105, as described in U.S. Pat. Nos. 5,393,993, 5,523,589, 6,177,688, and application Ser. No. 09/154,363 entitled Vertical Geometry InGaN Light Emitting Diode, the disclosures of which are hereby incorporated herein by reference.

The active region 120 may comprise a single layer of n-type, p-type, or intrinsic gallium nitride-based materials, another homostructure, a single heterostructure, a double heterostructure, and/or a quantum well structure, all of which are well known to those skilled in the art. Moreover, the active region 120 may comprise a light-emitting layer bounded by one or more cladding layers. The n-type gallium nitride layer 115 may comprise silicon-doped gallium nitride, while the p-type gallium nitride layer 125 may comprise magnesium-doped gallium nitride. In addition, the active region 120 may include at least one indium gallium nitride quantum well.

In some LEDs, the ohmic contact 135 for the p-type gallium nitride layer 125 comprises platinum, nickel and/or titanium/gold. In other LEDs, a reflective ohmic contact comprising, for example, aluminum and/or silver, may be used. The ohmic contact 130 to the n-type gallium nitride layer 115 may comprise aluminum and/or titanium. Other suitable materials that form ohmic contacts to p-type gallium nitride and n-type gallium nitride may be used for ohmic contacts 135 and 130, respectively. Examples of ohmic contacts to n-type gallium nitride layers and p-type gallium nitride layers are described, for example, in U.S. Pat. No. 5,767,581, the disclosure of which is hereby incorporated herein by reference.

Unfortunately, the majority of light that is generated inside of an LED device typically never escapes the device because of various optical losses, such as total internal reflection (TIR). Referring now to FIG. 2, when light travels from one medium to another, it may be refracted such that the angle of refraction is governed by Snell's law as follows: $n_1 \sin \theta_1 = n_2 \sin \theta_2$, where $n_1$ is the index of refraction for medium 1 and $n_2$ is the index of refraction for medium 2. The light that escapes, however, has an angular dependence that is less than the "critical angle," which is defined as follows $\theta_{1critical} = \sin^{-1}(n_2/n_1)$. Light that is incident at an angle greater than the critical angle does not pass through to medium 2, but is instead reflected back into medium 1. This reflection is commonly called total internal reflection. Thus, mediums having significantly different indices of refraction may result in a relatively small critical angle for light transmitted through the two mediums and may result in significant optical loss due to total internal reflection.

SUMMARY OF THE INVENTION

According to some embodiments of the present invention, a light-emitting device comprises a substrate that is at least partially transparent to optical radiation and has a first index of refraction. A diode region is disposed on a first surface of the substrate and is configured to emit light responsive to a voltage applied thereto. An antireflective layer is disposed on a second surface of the substrate and has a graded index of refraction having values in a range between about the first index of refraction at a first surface of the antireflective layer and about a second index of refraction corresponding to an index of refraction of an encapsulation material at a second surface of the antireflective layer. In other embodiments, the encapsulation material may be omitted and the antireflective layer may separate the substrate, which has a first index of refraction, from air, which has a second index of refraction.

Advantageously, by using the antireflective layer to transition between a first medium, e.g., the substrate, and a second medium, e.g., the encapsulation material or air, abrupt index of refraction changes may be avoided, which may reduce the amount of light reflected internally at boundaries of the substrate and/or the encapsulation material.

In other embodiments, the substrate may comprise SiC and/or $Al_2O_3$, and the antireflective layer may comprise $(SiC)_x(SiO_2)_{1-x}$ and/or $(Al_2O_3)_x(SiO_2)_{1-x}$. In still other embodiments, the antireflective layer may comprise a polymer.

In further embodiments, the substrate may comprise SiC with an index of refraction of about 2.6 and the encapsulation material has an index of refraction of about 1.5. The substrate may also comprise $Al_2O_3$ with an index of refraction of about 1.8 and the encapsulation material has an index of refraction of about 1.5.

The graded index of refraction may be represented as a function f(x), where x represents a thickness of the antireflective layer beginning at the first surface of the antireflective layer and ending at the second surface of the antireflective layer. In particular embodiments, f(x) is linear.

The antireflective layer may be formed on the substrate using a deposition process, such as chemical vapor deposition (CVD) and/or plasma enhanced chemical vapor deposition (PECVD) according to some embodiments. In other embodiments, the antireflective layer may be formed on the substrate using, for example, thermal evaporation, e-beam evaporation, sputtering, spin-coating, sol-gel spin coating, and/or plating.

In particular embodiments in which the substrate comprises SiC and the antireflective layer comprises $(SiC)_x(SiO_2)_{1-x}$, the antireflective layer may be formed by applying $(SiC)_x(SiO_2)_{1-x}$ to the SiC substrate by decreasing the value of x during an application time interval. In other embodiments in which the substrate comprises $Al_2O_3$, the antireflective layer may be formed by applying $(Al_2O_3)_x(SiO_2)_{1-x}$ to the $Al_2O_3$ substrate by decreasing the value of x during an application time interval. When the substrate comprises SiC and the antireflective layer comprises $(SiC)_x(SiO_2)_{1-x}$, the value of x may be about 1.0 at a beginning of the application time interval and about 0 at the end of the application time interval. When the substrate comprises $Al_2O_3$, and the antireflective layer comprises $(Al_2O_3)_x(SiO_2)_{1-x}$, the value of x may be about 1.0 at a beginning of the application time interval and about 0 at the end of the application time interval.

Embodiments of the present invention are not limited to flip-chip structures in which light is extracted through a substrate that is at least partially transparent to optical radiation. In other embodiments, a light-emitting device comprises a substrate and a diode region on a surface of the substrate that is configured to emit light responsive to a voltage applied thereto. A light extraction layer is disposed on a the diode region that has a first index of refraction and an antireflective layer is disposed on the light extraction layer that has a graded index of refraction having values in a range between about the first index of refraction at a first surface of the antireflective layer and about a second index of refraction associated with a second medium adjacent to a second surface of the antireflective layer. Thus, light may be extracted through the light extraction layer, which may be implemented, for example, as an at least partially transparent ohmic contact. In particular embodiments, the light extraction layer comprises platinum, and the first index of refraction is about 2.33.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
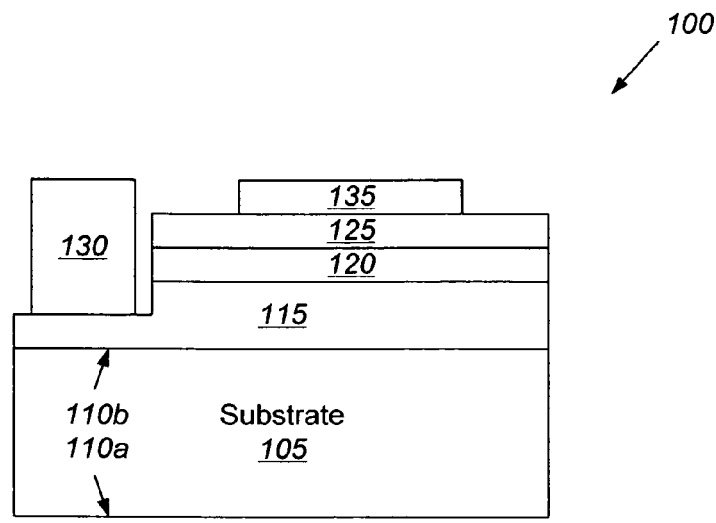
FIG. 1 is a cross-sectional diagram that illustrates a conventional GaN-based light-emitting diode (LED)

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. Each embodiment described herein also includes its complementary conductivity type embodiment.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first region, layer or section discussed below could be termed a second region, layer or section, and, similarly, a second without departing from the teachings of the present invention.

Embodiments of the present invention will now be described, generally, with reference to GaN-based light-emitting diodes (LEDs) on SiC-based and sapphire ($Al_2O_3$)-based substrates. The present invention, however, is not limited to such structures. Embodiments of the invention may use any substrate that is generally non-absorbing or at least partially transparent to optical radiation and a diode region that emits light responsive to a voltage applied thereto.

Examples of light-emitting devices that may be used in embodiments of the present invention include, but are not limited to, the devices described in the following U.S. Pat. Nos. 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference. Other suitable LEDs and/or lasers are described in U.S. patent application Ser. No. 10/140,796, entitled "GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES", filed May 7, 2002, as well as U.S. patent application Ser. No. 10/057,821, filed Jan. 25, 2002 entitled "LIGHT EMITTING DIODES INCLUDING SUBSTRATE MODIFICATIONS FOR LIGHT EXTRACTION AND MANUFACTURING METHODS THEREFOR" the disclosures of which are incorporated herein as if set forth fully. Furthermore, phosphor coated LEDs, such as those described in U.S. patent application Ser. No. 10/659,241 entitled "PHOSPHOR-COATED LIGHT EMITTING DIODES INCLUDING TAPERED SIDEWALLS, AND FABRICATION METHODS THEREFOR," filed Sep. 9, 2003, the disclosure of which is incorporated by reference herein as if set forth full, may also be suitable for use in embodiments of the present invention.

The LEDs and/or lasers may be configured to operate in a "flip-chip" configuration such that light emission occurs through the substrate. In such embodiments, the substrate may be patterned so as to enhance light output of the devices as is described, for example, in U.S. patent application Ser. No. 10/057,821, filed Jan. 25, 2002 entitled "LIGHT EMITTING DIODES INCLUDING SUBSTRATE MODIFICATIONS FOR LIGHT EXTRACTION AND MANUFACTURING METHODS THEREFOR" the disclosure of which is incorporated herein by reference as if set forth fully herein.

Figure 3:
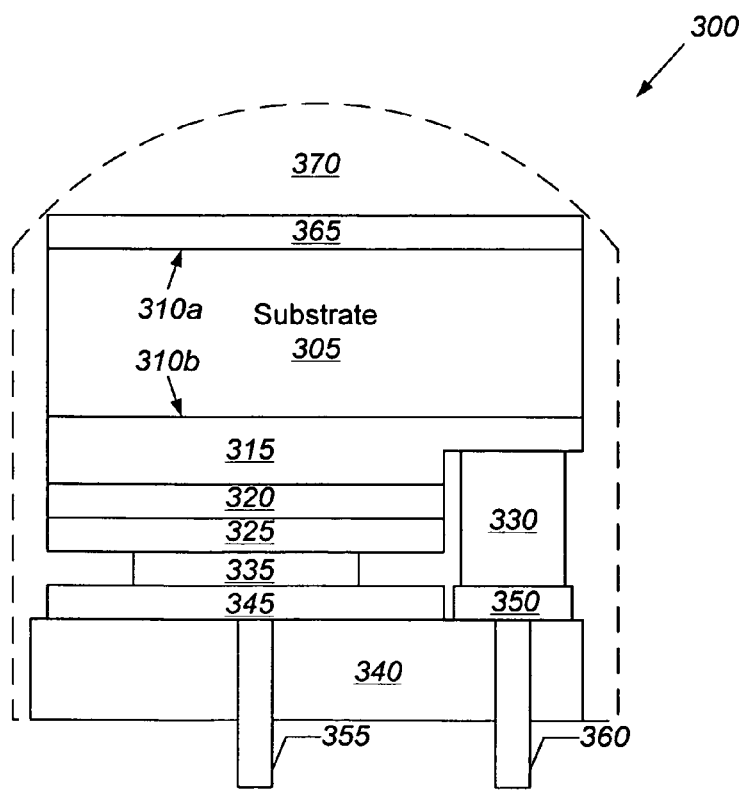
FIG. 3 is a cross-sectional diagram that illustrates light-emitting devices and fabrication methods therefor, in accordance with some embodiments of the present invention.
Figure 2:
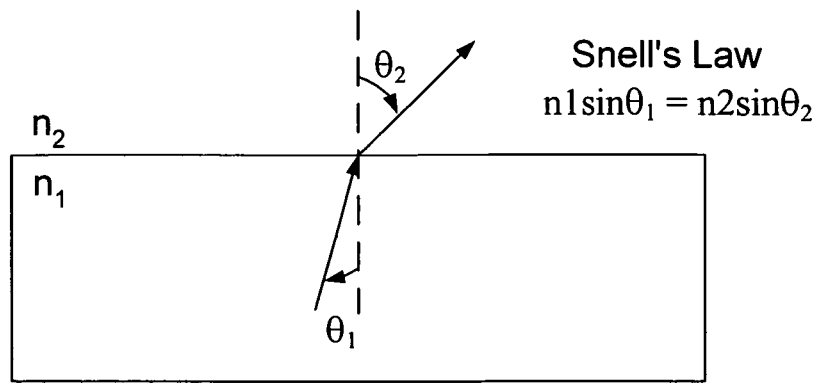
FIG. 2 is a cross-sectional diagram that illustrates light traveling between two mediums having different indices of refraction.

Referring now to FIG. 3, a light-emitting device 300, in accordance with some embodiments of the present invention, is illustrated. The light-emitting device 300 comprises a GaN-based LED similar to the GaN LED described above with respect to FIG. 1. Shown in a flip-chip configuration in FIG. 3, the GaN-based LED comprises a substrate 305 that has first and second opposing surfaces 310a and 310b, respectively, and is at least partially transparent to optical radiation. The substrate 305 may be, for example, but is not limited to, a SiC substrate or a sapphire ($Al_2O_3$) substrate. A diode region, comprising an n-type layer 315, an active region 320, and a p-type layer 325 is disposed on the second surface 310b and is configured to emit optical radiation into the substrate 305 upon application of a voltage across the diode region, for example across ohmic contacts 330 and 335.

The diode region including the n-type layer 315, the active region 320, and/or the p-type layer 325 may comprise gallium nitride-based semiconductor layers, including alloys thereof, such as indium gallium nitride and/or aluminum indium gallium nitride. The fabrication of gallium nitride on silicon carbide is described, for example, in the above-incorporated U.S. Pat. No. 6,177,688. A buffer layer or layers comprising aluminum nitride, for example, may be provided between the n-type gallium nitride layer 315 and the silicon carbide substrate 305, as described in the above-incorporated U.S. Pat. Nos. 5,393,993, 5,523,589, 6,177,688, and application Ser. No. 09/154,363 entitled Vertical Geometry InGaN Light Emitting Diode.

The active region 320 may comprise a single layer of n-type, p-type, or intrinsic gallium nitride-based materials, another homostructure, a single heterostructure, a double heterostructure, and/or a quantum well structure. Moreover, the active region 320 may comprise a light-emitting layer bounded by one or more cladding layers. The n-type gallium nitride layer 315 may comprise silicon-doped gallium nitride, while the p-type gallium nitride layer 325 may comprise magnesium-doped gallium nitride. In addition, the active region 320 may include at least one indium gallium nitride quantum well.

In some embodiments, the ohmic contact 335 for the p-type gallium nitride layer 325 comprises platinum, nickel and/or titanium/gold. In other embodiments, a reflective ohmic contact comprising, for example, aluminum and/or silver, may be used. The ohmic contact 330 to the n-type gallium nitride layer 315 may comprise aluminum and/or titanium. Other suitable materials that form ohmic contacts to p-type gallium nitride and n-type gallium nitride may be used for ohmic contacts 335 and 330, respectively. Examples of ohmic contacts to n-type gallium nitride layers and p-type gallium nitride layers are described, for example, in the above-incorporated U.S. Pat. No. 5,767,581.

The LED is shown in flip-chip or upside-down configuration mounted on a mounting support 340, such as a heat sink, using bonding regions 345 and 350. The bonding regions 345 and 350 may include solder preforms that are attached to the diode region and/or the mounting support 340, and that can be reflowed to attach the ohmic contacts 335 and 330 to the mounting support 340 using conventional solder reflowing techniques. Other embodiments of bonding regions 345 and 350 may comprise gold, indium, and/or braze. An anode lead 355 and a cathode lead 360 may be provided for external connections.

As also shown in FIG. 3, the flip-chip or upside-down packing configuration places the substrate 305 away from the mounting support 340 and places the diode region down, adjacent to the mounting support 340. A barrier region (not shown) may be included between the ohmic contacts 335, 330 and the bonding regions 345, 350. The barrier region may comprise nickel, nickel/vanadium, and/or titanium/tungsten. Other barrier regions may also be used.

In accordance with some embodiments of the present invention, an antireflective layer 365 is disposed on the substrate surface 310a and has a graded index of refraction that assumes values in a range between about a first index of refraction associated with a first medium that is adjacent thereto (e.g., the substrate 305) and a second index of refraction associated with a second medium that is adjacent thereto. In accordance with various embodiments of the present invention, the second medium may be air or an encapsulation material 370 as shown in FIG. 3.

Thus, in accordance with some embodiments of the present invention, the antireflective layer has a graded index of refraction that assumes values in a range between two different indices of refraction associated with different optical transmission mediums. Advantageously, by using the antireflective layer to transition between the different mediums, abrupt index of refraction changes may be avoided, which may reduce the amount of light reflected internally at boundaries of one or both of the mediums.

In embodiments in which the substrate 305 is SiC, the antireflective layer 365 may comprise $(SiC)_x(SiO_2)_{1-x}$. In embodiments in which the substrate 305 is sapphire ($Al_2O_3$), the antireflective layer 365 may comprise $(Al_2O_3)_x(SiO_2)_{1-x}$. In other embodiments, the antireflective layer 365 may comprise a polymer, such as a sol-gel polymer combination supplied by Waveguide Solutions, Inc. of Charlotte, N.C.

Figure 4:
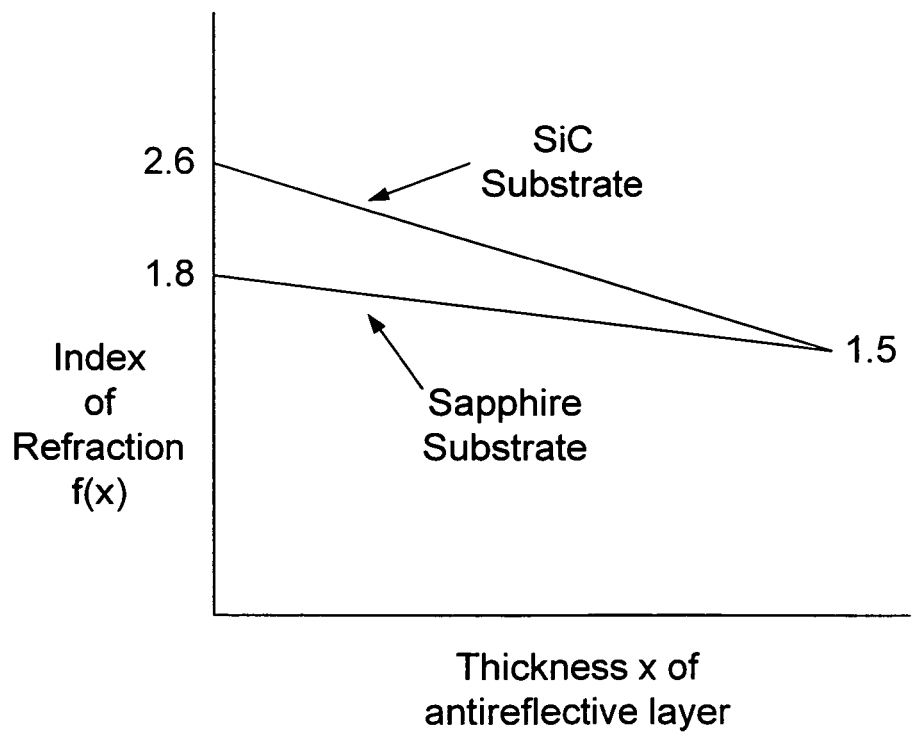
FIG. 4 is a graph that illustrates plots of the graded index of refraction versus thickness of an antireflective layer for various substrate materials, in accordance with some embodiments of the present invention.

In some embodiments of the present invention illustrated in FIG. 4, the antireflective layer 365 may comprise a graded index of refraction that is based on a difference between first and second indices of refraction associated with first and second mediums respectively. The index of refraction of SiC may be about 2.6 and the index of refraction of sapphire ($Al_2O_3$), may be about 1.8. The index of refraction of an encapsulation material that may comprise plastic, glass, silicone gel, and/or other materials, may be about 1.5. The index of refraction of air may be about 1.0. As illustrated in FIG. 4, the index of refraction for the antireflective layer 365 is plotted against the thickness x of the antireflective layer 365 in which the antireflective layer 365 is disposed between a SiC substrate and an encapsulation material and in which the antireflective layer 365 is disposed between a sapphire ($Al_2O_3$) substrate and an encapsulation material. Similar graphs may be plotted for other substrate materials and/or encapsulation materials. In addition, graphs may be plotted for various substrate materials and no encapsulation material, i.e., embodiments in which the antireflection layer separates the substrate 305 from air.

The graded index of refraction may be represented as a function f(x), where x represents a thickness of the antireflective layer beginning at a first surface of the antireflective layer 365 (e.g., a surface adjacent a first light transmission medium) and ending at a second surface of the antireflective layer 365 (e.g., a surface adjacent a second light transmission medium). Abrupt changes in the index of refraction may increase the amount of optical radiation that is reflected back into the light-emitting device 300. In particular embodiments, f(x) may be linear to increase the amount of optical radiation that is transmitted out of the light-emitting device 300.

Figure 5:
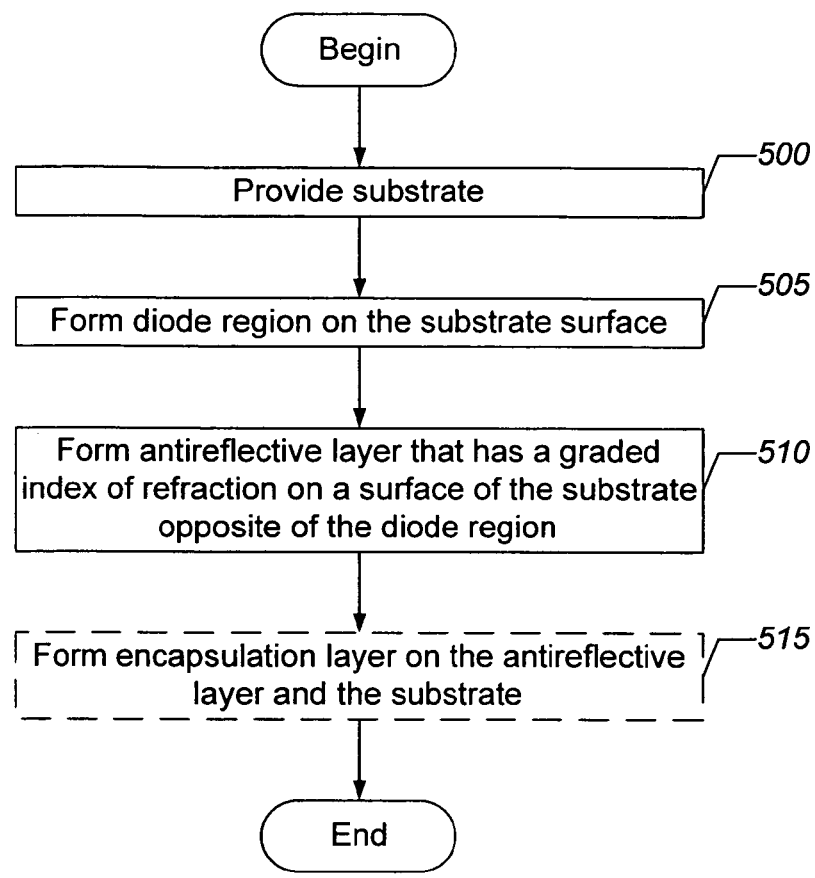
FIGS. 5 and 6 are flowcharts that illustrate exemplary operations for fabricating light-emitting devices, in accordance with some embodiments of the present invention.

Exemplary operations for forming light-emitting devices, in accordance with some embodiments of the present invention will now be described with reference to the flowcharts of FIGS. 5 and 6 and the cross-sectional illustration of FIG. 3. Referring now to FIG. 5, operations begin at block 500 where a substrate 305 is provided. A diode region, i.e., layers 315, 320, and 325, is formed on the substrate surface 310b at block 505. An antireflective layer 365 that has a graded index of refraction is formed on the substrate surface 310a at block 510. The antireflective layer 365 may be formed on the substrate 305 using a deposition process such as chemical vapor deposition (CVD) and/or plasma enhanced chemical vapor deposition (PECVD) according to some embodiments. In other embodiments, the antireflective layer 365 may be formed on the substrate 305 using a process such as thermal evaporation, e-beam evaporation, sputtering, spin-coating, sol-gel spin coating, and/or plating. Optionally, the encapsulation material 370 may be formed on the antireflective layer 365 and the substrate 305 at block 515.

Figure 6:
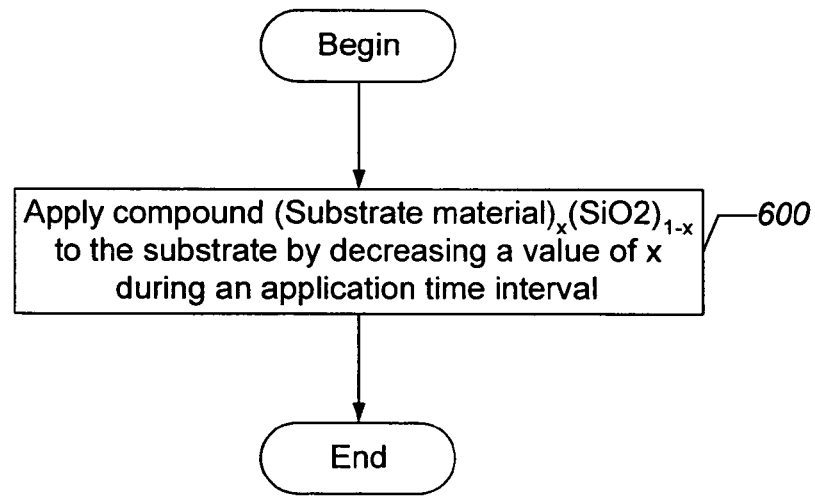

In particular embodiments of the present invention illustrated in FIG. 6, the antireflective layer 365 may be formed by applying a compound that comprises (substrate 305 material)$_x(SiO_2)_{1-x}$ to the substrate by decreasing the value of x during an application time interval at block 600. The substrate 305 may comprise, for example, SiC or sapphire ($Al_2O_3$) as discussed above, in accordance with various embodiments of the present invention.

When the substrate 305 comprises SiC and the antireflective layer 365 comprises $(SiC)_x(SiO_2)_{1-x}$, the value of x may be about 1.0 at a beginning of the application time interval and about 0 at the end of the application time interval. When the substrate 305 comprises $Al_2O_3$, and the antireflective layer 365 comprises $(Al_2O_3)_x(SiO_2)_{1-x}$, the value of x may be about 1.0 at a beginning of the application time interval and about 0 at the end of the application time interval.

Figure 7:
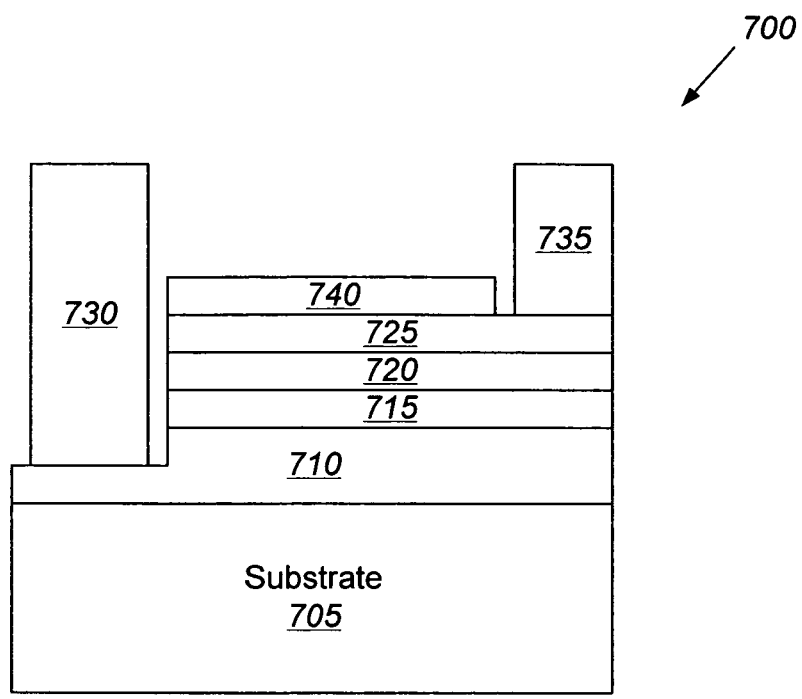
FIG. 7 is a cross-sectional diagram that illustrates light-emitting devices and fabrication methods therefor, in accordance with some embodiments of the present invention.

Embodiments of the present invention have been described above with reference to "flip-chip" configurations in which light is extracted through a substrate that is at least partially transparent to optical radiation. The present invention, however, is not limited to such structures. As shown in FIG. 7, a light-emitting device 700, in accordance with some embodiments of the present invention, may provide for the extraction of light through a light extraction layer, such as a transparent electrode. Referring now to FIG. 7, the light-emitting device 700 comprises a substrate 705 and a diode region disposed thereon, which comprises an n-type layer 710, an active region 715, and a p-type layer 720. The light-emitting device 700 further comprises a light extraction layer 725 that is disposed on the p-type layer 720 and may comprise a thin, at least partially transparent, ohmic contact, such as platinum. The index of refraction of platinum may be about 2.33. The diode region is configured to emit optical radiation out through the light extraction layer 725 upon application of a voltage across the diode region using, for example, ohmic contacts 730 and 735, respectively.

As shown in FIG. 7, an antireflective layer 740, such as, for example, the antireflective layer 365 discussed above with respect to FIG. 3, is disposed on the light extraction layer 725 and has a graded index of refraction that assumes values in a range between about a first index of refraction associated with a first medium that is adjacent thereto (e.g., the light extraction layer 725) and a second index of refraction associated with a second medium that is adjacent thereto (e.g., air, encapsulation material, such as plastic, glass, silicone gel, etc.) As discussed above with respect to FIG. 3, the antireflective layer may be used to transition between different mediums to avoid abrupt changes in the index of refraction, which may reduce the amount of light reflected internally at boundaries of one or both of the mediums.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A light-emitting device, comprising:
   a light extraction layer; and
   an antireflective layer on the light extraction layer that has a graded index of refraction having values in a range associated with a first index of refraction at a first surface of the antireflective layer and associated with a second index of refraction corresponding to an index of refraction of a medium at a second surface of the antireflective layer;
   wherein the medium at the second surface is an encapsulant material.

2. The light-emitting device of claim 1, wherein the light extraction layer is an at least partially transparent ohmic contact.

3. The light-emitting device of claim 1, wherein the light extraction layer comprises platinum.

4. The light-emitting device of claim 1, wherein the light-emitting device is a gallium nitride light-emitting device.

5. The light-emitting device of claim 1, wherein the graded index of refraction is represented as a function f(x), where x represents a thickness of the antireflective layer beginning at the first surface of the antireflective layer and ending at the second surface of the antireflective layer.

6. The light-emitting device of claim 5, wherein f(x) is linear.

* * * * *